US009514908B2

(12) United States Patent
Fuchs et al.

(10) Patent No.: US 9,514,908 B2
(45) Date of Patent: Dec. 6, 2016

(54) METHOD AND DEVICE FOR GENERATING A FOCUSED STRONG-CURRENT CHARGED-PARTICLE BEAM

(71) Applicants: ECOLE POLYTECHNIQUE, Palaiseau (FR); CENTRE NATIONAL DE LA RECHERCHE SCIENTIFIQUE (C.N.R.S), Paris (FR); INSTITUT NATIONAL DE LA RECHERCHE SCIENTIFIQUE (INRS), Quebec (CA)

(72) Inventors: Julien Fuchs, Paris (FR); Bruno Albertazzi, Fameck (FR); Henri Pepin, Pau (FR); Emmanuel D'Humieres, Talence (FR)

(73) Assignees: ECOLE POLYTECHNIQUE, Palaiseau (FR); CENTRE NATIONAL DE LA RECHERCHE SCIENTIFIQUE (C.N.R.S.), Paris (FR); INSTITUT NATIONAL DE LA RECHERCHE SCIENTIFIQUE (INRS), Quebec (CA)

( * ) Notice: Subject to any disclaimer, the term of this patent is extended or adjusted under 35 U.S.C. 154(b) by 0 days.

(21) Appl. No.: 14/437,739

(22) PCT Filed: Oct. 22, 2013

(86) PCT No.: PCT/FR2013/052517
§ 371 (c)(1),
(2) Date: Apr. 22, 2015

(87) PCT Pub. No.: WO2014/064380
PCT Pub. Date: May 1, 2014

(65) Prior Publication Data

US 2015/0303019 A1 Oct. 22, 2015

(30) Foreign Application Priority Data

Oct. 22, 2012 (FR) ..................................... 12 60040

(51) Int. Cl.
*H01J 37/04* (2006.01)
*H01J 3/22* (2006.01)
*G21K 1/093* (2006.01)

(52) U.S. Cl.
CPC *H01J 3/22* (2013.01); *G21K 1/093* (2013.01)

(58) Field of Classification Search
USPC .................. 250/396 R, 397, 396 ML, 492.1, 492.2,250/492.3, 423 R, 424, 423 P, 423 F
See application file for complete search history.

(56) References Cited

U.S. PATENT DOCUMENTS

2008/0191143 A1 8/2008 Willi et al.

FOREIGN PATENT DOCUMENTS

DE 10 2008 044781 A1 3/2010
WO 03/029797 A2 4/2003

OTHER PUBLICATIONS

"Laser-Driven Proton Beams: Acceleration Mechanism, Beam Optimization, and Radiographic Application", IEEE Transactions on Plasma Science, vol. 36 No. 4, 2008, pp. 1833-1842.*

(Continued)

*Primary Examiner* — Nicole Ippolito
(74) *Attorney, Agent, or Firm* — Oliff PLC

(57) ABSTRACT

The invention relates to a method for generating a focused charged-particle beam, comprising at least the steps of: a) generating a charged-particle beam (10); b) emitting a laser pulse (40); c) generating a focusing magnetic field structure in a target (50) by means of an interaction between the laser (Continued)

pulse and the target; and d) making the charged-particle beam penetrate the focusing magnetic field structure at least partially.

11 Claims, 3 Drawing Sheets

(56) References Cited

OTHER PUBLICATIONS

Jan. 30, 2014 International Search Report issued in International Patent Application No. PCT/FR2013/052517.

Borghesi et al; "Laser-driven proton beams: acceleration mechanism, beam optimization, and radiographic applications;" IEEE Transactions of Plasma Science; Aug. 2008; vol. 36; No. 4; pp. 1833-1842.

Sentoku et al; "Dynamic control over mega-ampere electron currents in metals using ionization-driven resistive magnetic fields;" Physical Review Letters; Sep. 23, 2011; vol. 107; No. 13; pp. 135005-1-135005-2.

Borghesi et al.; "Proton imaging: a diagnostic for inertial confinement fusion/fast ignitor studies;" Plasma Physics and Controlled Fusion; vol. 43; Nov. 2001; pp. A267-A276.

Antici et al; "Energetic protons generated by ultrahigh contrast laser pulses interacting with ultrathin targets;" Physics of Plasmas, American Institute of Physics; Mar. 19, 2007; vol. 14; No. 3; pp. 30701-1.

MacKinnon et al; "Proton radiography as an electromagnetic field and density perturbation diagnostic;" Review of Scientific Instruments; Oct. 5, 2004; vol. 75; No. 10; pp. 3531-3533.

Toncian et al; "Ultrafast laser-driven microlens to focus and energy-select mega-electron volt protons;" Science; Apr. 21, 2006; vol. 312; pp. 410-413.

* cited by examiner

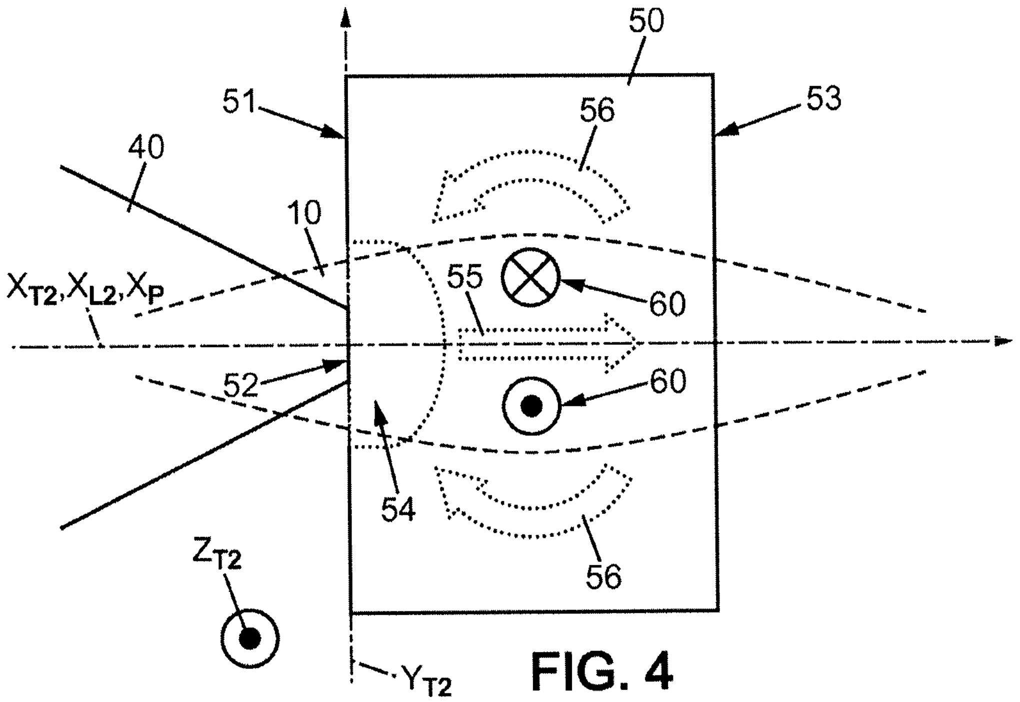
FIG. 4
FIG. 5
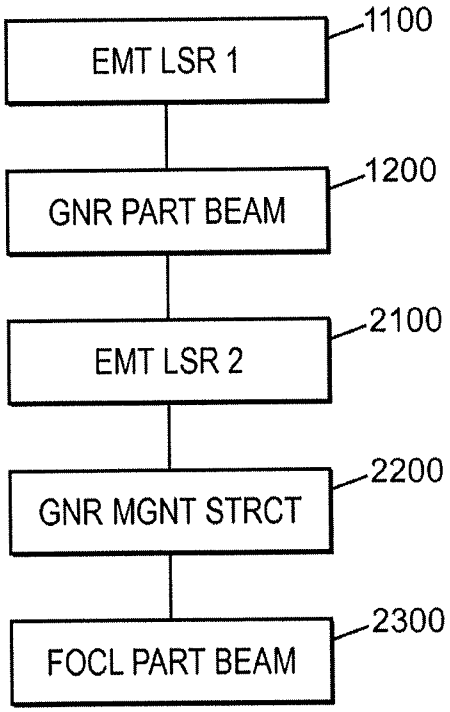

METHOD AND DEVICE FOR GENERATING A FOCUSED STRONG-CURRENT CHARGED-PARTICLE BEAM

The present invention relates to methods for generating a focused beam of charged particles of high current and to devices for generating such beams.

More particularly, the invention pertains to a method for generating a focused pulsed beam of charged particles of high current, the beam of particles having for example a duration of the order of a picosecond, a current of the order of a kilo-ampere and being formed of particles having an energy of the order of a megaelectronvolt.

It is for example possible to generate such beams by means of an interaction between a laser of high power and a solid or gaseous target.

These beams are usually highly divergent and it is desirable to be able to focus them for applications such as for example the probing of physical phenomena, inertial fusion or the generating of intense radiations.

Unfortunately, the intensity of such beams renders them difficult to focus. Thus, the four-pole magnets commonly used to focus charged particle beams in particle accelerators are perturbed by the electromagnetic field of the intense beam and do not operate appropriately.

Chromatic focusing devices, for example that described in "Ultrafast laser-driven microlens to focus and energy-select mega-electron volt protons" by T. Toncian et al. (SCIENCE, vol. 312, 21 Apr. 2006) are known, however such a device selects an energy in the spectrum of the particle beam and a large part of the beam is therefore not focused.

There therefore exists a need for a generating device capable of generating a focused pulsed beam of charged particles of high current.

For this purpose, according to the invention, a method for generating a focused beam of charged particles comprises at least the steps of a) generating a beam of charged particles;

b) emitting a laser pulse;

c) generating a focusing magnetic field structure in a target by means of an interaction of said laser pulse with said target; and d) causing at least partial penetration of the beam of charged particles into said focusing magnetic field structure.

By virtue of these provisions, an intense and compact structure of magnetic fields may be generated in the target. The amplitude of these fields is sufficient to focus a pulsed beam of charged particles of high current without them being substantially perturbed by the field generated by said beam. The focusing may be stable for the whole of the duration of passage of the charged particle beam, for example several picoseconds, thereby allowing achromatic focusing of the pulsed beam of charged particles. The focusing intensity is adjustable as a function of the intensity of the laser pulse. The focusing of positively or negatively charged particles is possible simply by changing the direction of propagation of the laser pulse generating the magnetic field structure with respect to the direction of propagation of the pulsed beam of charged particles.

In preferred embodiments of the invention, it is optionally possible to have recourse furthermore to one and/or the other of the following provisions:

- the laser pulse possesses a power lying substantially between a terawatt and about a hundred terawatts;
- the laser pulse possesses a duration lying substantially between about ten femtoseconds and about ten picoseconds;

- in the course of step c), the laser pulse is focused on the target at the level of a focal spot and in the course of step d), the beam of charged particles passes at least partially through said focal spot;
- the target is made at least in part of a metal;
- the target is made at least in part of a metal chosen from a list comprising gold, copper and aluminum;
- the target extends substantially along a plane of extension between a front face and a rear face, said faces being opposite to one another in a thickness direction perpendicular to the plane of extension and separated by a thickness measured in said thickness direction, and in the course of step d), said beam passes through the target substantially in said thickness direction;
- the thickness of the target lies substantially between 500 nanometers and about a hundred micrometers;
- step a) of generating a particle beam comprises the emission of a generating laser pulse and the generation of a non-focused beam of particles by means of an interaction of said generating laser pulse with a generating target.

The subject of the invention is also a device for generating a focused beam of charged particles comprising means for generating a beam of charged particles;

a laser source for emitting a laser pulse;

a target for generating a focusing magnetic field structure by means of an interaction of said laser pulse with said target, said beam of charged particles penetrating at least partially into said magnetic field structure.

In preferred embodiments of the invention, the means for generating a beam of charged particles may optionally comprise a laser source for emitting a generating laser pulse; and a generating target for generating a beam of charged particles upon an interaction of said generating laser pulse with said generating target.

Other characteristics and advantages of the invention will be apparent in the course of the following description of several of its embodiments given by way of nonlimiting example, with regard to the attached drawings.

Figure 3A:
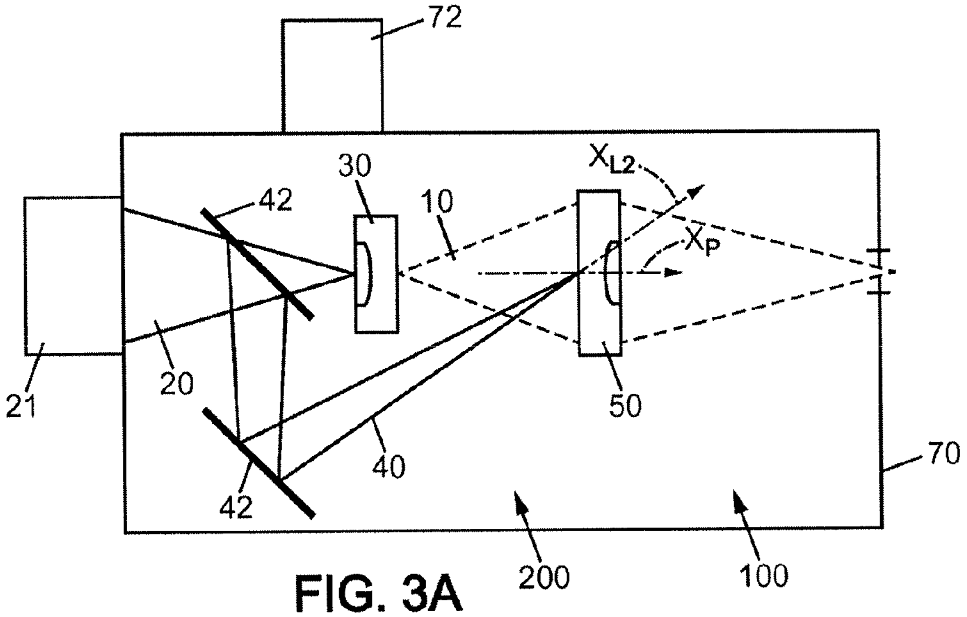
Figure 3B:
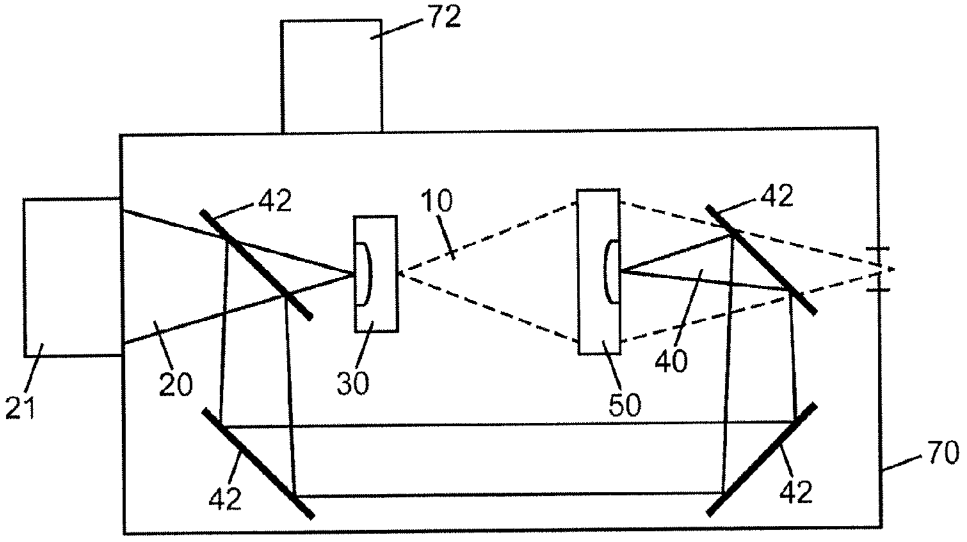

FIGS. 3*a* and 3*b* are schematic illustrations of two embodiments of a device for focusing a beam of charged particles of high current and of a device for generating a focused beam of charged particles of high current according to the invention;

FIG. 4 is a detailed schematic illustration of a method for focusing a beam of charged particles of high current according to an embodiment of the invention; and FIG. 5 is a flowchart of an embodiment of a method for generating a focused beam of charged particles of high current according to an embodiment of the invention.

In the various figures, the same references designate identical or similar elements.

The invention pertains to a method for generating a focused pulsed beam of charged particles of high current 10.

Such a beam of particles 10 may have a duration of the order of a picosecond, for example between a few tens of femtoseconds and a few tens of picoseconds, for example three hundred femtoseconds.

Such a beam of particles 10 may have a current of the order of a kilo-ampere, for example of a few amperes to a few mega-amperes, and be formed of particles having energy of up to as much as a few tens of megaelectronvolts, for example up to sixty megaelectronvolts.

Advantageously the beam of particles 10 may comprise a significant fraction of particles with an energy greater than a megaelectronvolt, for example more than half the particles.

Such beams are for example used in applications such as the probing of physical phenomena, inertial fusion or the generating of intense radiations.

With reference to FIGS. 1 to 5, such a beam 10 may for example be generated by an interaction between a high power generating laser pulse 20 and a generating target 30.

The generating laser pulse 20 may have a high power, for example about a hundred terawatts.

The laser beam may for example consist of a pulse having an energy of about thirty Joules and a duration of about three hundred femtoseconds. In other embodiments, the intensity of the first laser pulse may for example lie between a few Joules and a few kilojoules, and the duration of the laser pulse may lie between a few tens of femtoseconds and a few tens of picoseconds.

The generating laser pulse 20 may be generated 1100 by a first laser source 21 of high power and propagate in a direction of propagation $X_{L1}$.

The generating target 30 may be a solid, liquid or gaseous target, for example an aluminum film 15 micrometers in thickness, as described in "Ultrafast laser-driven microlens to focus and energy-select mega-electron volt protons" by T. Toncian et al. (SCIENCE, vol. 312, 21 Apr. 2006) and the references cited in this article.

It may extend substantially along a plane of extension $Y_{T1}Z_{T1}$.

An interaction 1200 between the generating pulse 20 and the generating target 30 may be obtained by at least partially focusing said pulse on said target.

Thus, the generating laser pulse 20 is focused, by means of optical focusing devices, on a front face 31 of the generating target 30 at the level of a focal spot 32 of restricted dimensions, for example around 6 micrometers in width at half the maximum intensity ("FWHM").

This laser pulse 20 creates a plasma 34 at the level of the front face 31 of the generating target 30 by ionizing the atoms of the target 30 that are situated at the level of the focal spot 32.

The laser pulse 20 heats the generating target 30 and communicates to the electrons of said target 30 a significant thermal energy which may lead a part 35 of said electrons to pass through the target so as to escape therefrom at the level of the rear face 33, said rear face 33 being a face of the generating target 30 opposite with respect to the front face 31 in a thickness direction $X_{T1}$ of the first target, said thickness direction $X_{T1}$ being for example substantially perpendicular to the plane of extension of the first target $T_{T1}Z_{T1}$.

In one embodiment, the thickness direction $X_{T1}$ of the generating target 30 and the direction of propagation of the first laser pulse $X_{L1}$ may be substantially collinear.

As a variant, the direction of propagation $X_{L1}$ of the laser may be inclined with respect to said thickness direction of the first target $X_{T1}$, for example by 45° or more. The first laser pulse 20 therefore generates a displacement of electrons 35 in the thickness of the generating target 30 which constitutes a beam of electrons 35 set into motion substantially in the thickness direction $X_{T1}$ of the generating target 30.

By extending outside of the target at the level of the rear face, these electrons may produce significant electric fields 36 at the level of said rear face 33 (of the order of a tera-volt per meter).

These electric fields 36 may in particular be sufficiently intense to strip ions 11 from the rear face (for example impurities trapped on the opposite surface) and thus produce 1200 a beam 10 of charged particles 11.

The energy of said charged particles 11 may for example reach as much as sixty or a hundred megaelectronvolts and the doses may for example be of the order of 10^11 to 10^13 particles per pulse.

A pulse of such a beam 10 may for example last less than a picosecond, that is to say substantially the duration of the first laser pulse and the current generated may thus be of the order of a few kilo-amperes to a few hundreds of kilo-amperes.

The beam of electrons 35 set into motion in the thickness of the generating target 30 by the first laser pulse 20 may be divergent. The beam of charged particles 10 created may thus likewise be divergent.

This makes it necessary to focus said beam of particles so as to be able to use it in several applications, including those mentioned hereinabove.

Thus, with reference to FIGS. 1 to 5, a method for generating a focused beam of charged particles of high current may comprise the following steps.

A step a) comprises the generation of a beam of particles 10, for example by means of the operation described hereinabove.

A second step b) 2100 may comprise the emission of a second laser pulse 40.

This second laser pulse 40 may have a power of a few terawatts, a few tens of terawatts or more.

This second laser pulse 40 may have a duration lying between about ten femtoseconds and a few tens of picoseconds.

Figure 1:
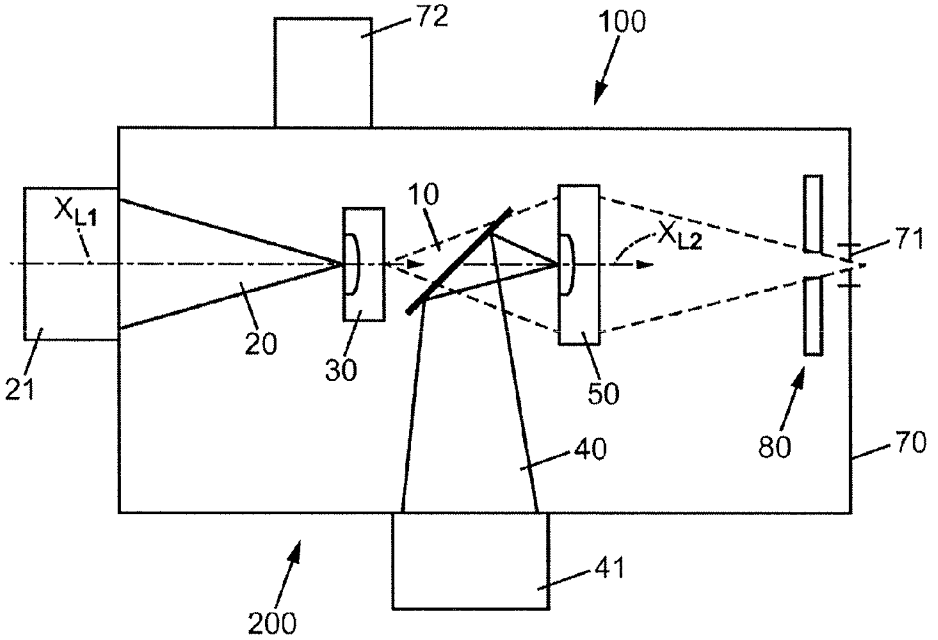
FIG. 1 is a schematic illustration of a device for focusing a beam of charged particles of high current and of a device for generating a focused beam of charged particles of high current according to an embodiment of the invention.
Figure 2:
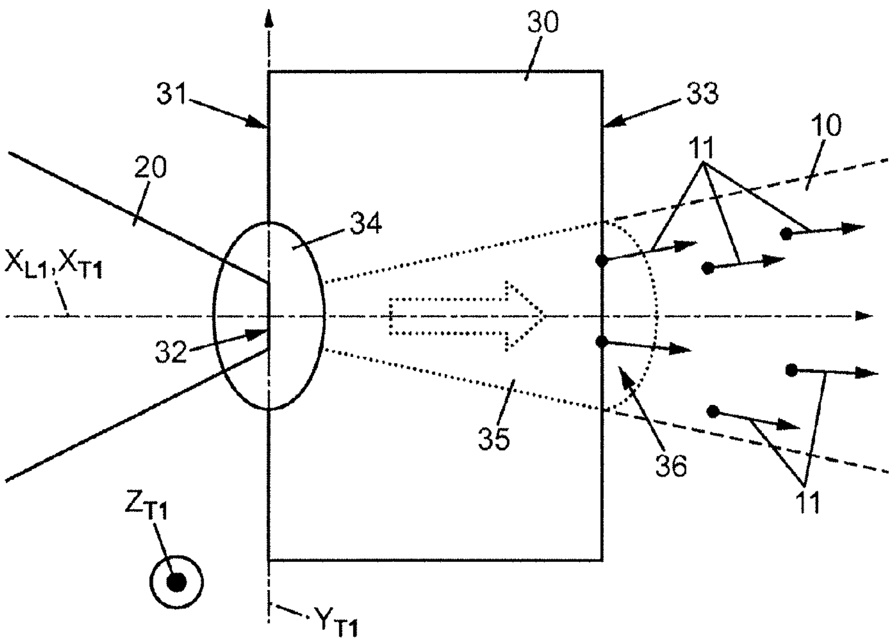
FIG. 2 is a detailed schematic illustration of an interaction between a first laser pulse and a first target in an embodiment of a method for generating a focused beam of charged particles of high current according to an embodiment of the invention.

The second laser pulse 40 may be emitted by a second laser source 41, as illustrated in FIG. 1 or, alternatively, it may be emitted by the first high power laser source 21 as illustrated in FIG. 3*a* and for example refocused by means of focusing devices 42 such as for example mirrors, circumventing the first target 30.

The second step b) 2100 may also comprise the increasing of the laser contrast of said second laser pulse 40 such as will now be described in greater detail.

The second laser pulse 40 usually comprises pre-pulses of second laser pulse 40 propagating just before the main laser pulse of the second laser pulse 40.

A device for increasing the laser contrast may in particular increase the laser contrast of the second laser pulse 40.

In one embodiment of the invention, a device for increasing the laser contrast is a device able to significantly decrease the intensity of the pre-pulses of the second laser pulse 40 with respect to the main laser pulse of the second laser pulse 40.

An incoming ratio is defined for example as being a ratio between the maximum intensity of the main laser pulse of the second laser pulse 40 and the maximum intensity of the pre-pulses of second laser pulse 40, for a second laser pulse 40 propagating upstream of the device for increasing the laser contrast.

An outgoing ratio is defined for example furthermore as being a ratio between the maximum intensity of the main laser pulse of the second laser pulse 40 and the maximum intensity of the pre-pulses of second laser pulse 40 for a second laser pulse 40 propagating downstream of the device for increasing the laser contrast.

A device for increasing the laser contrast may for example be such that the outgoing ratio is about ten times greater than the incoming ratio.

In a variant, a device for increasing the laser contrast may for example be such that the outgoing ratio is about a hundred times greater than the incoming ratio.

The device for increasing the laser contrast may in particular be integrated into a focusing device 42 in the following manner.

The focusing device 42 may for example comprise a plate that is transparent for the wavelength of the laser, for example a transparent glass plate.

The second laser pulse 40 may strike said focusing device 42 with an angle of incidence tilted from the normal.

The second laser pulse 40 may furthermore have a fluence such that pre-pulses of the second laser pulse 40 are of sufficiently low intensity to pass through said focusing device 42, or be reflected only by a few percent of intensity.

The intensity of the main laser pulse of the second laser pulse 40 being higher, the main laser pulse of the second laser pulse 40, in particular a rising edge of said main laser pulse of the second laser pulse 40, may trigger a plasma on a surface of the focusing device 42.

Said plasma on the surface of the focusing device 42 may in particular be able to reflect, for example to reflect by fifty percent to eighty percent of intensity, the main laser pulse of the second laser pulse 40 as a second reflected laser pulse.

By "plasma on a surface of the focusing device" is thus meant a plasma mirror able to reflect at least a portion of the main laser pulse of the second laser pulse 40.

Said second reflected laser pulse may then constitute the second laser pulse 40 refocused by means of focusing devices 42 for the remainder of the present description.

Such a device for increasing the laser contrast, comprising a transparent plate, may for example be such that the outgoing ratio is about ten times greater than the incoming ratio.

A device for increasing the laser contrast, comprising a transparent plate furnished with an antireflection treatment, may for example be such that the outgoing ratio is around a hundred times greater than the incoming ratio.

A third step c) 2200 may comprise the generation of a focusing magnetic field structure 60 in a second target 50 by means of an interaction of the second laser pulse 40 with said target 50.

The second target 50 may for example be a solid target. It may be a metallic target.

The second target 50 may for example comprise a part made of gold, aluminum or copper.

The second target 50 may for example extend substantially along a plane of extension $Y_{T2}Z_{T2}$, and comprise a front face 51 and a rear face 53 which are opposite with respect to one another in a thickness direction $X_{T2}$ perpendicular to said plane of extension $Y_{T2}Z_{T2}$.

Said front face 51 and rear face 53 may be separated by a thickness measured in the thickness direction $X_{T2}$ and for example lying between 500 nanometers and about a hundred micrometers, for example about ten micrometers.

An interaction between the second pulse 40 and the second target 50 may be obtained by at least partially focusing said pulse on said target.

Thus, the second laser pulse 40 may be focused on the front face 51 of the second target at a focal spot 52 of restricted dimensions, for example around 6 micrometers in width at half the maximum intensity ("FWHM").

In one embodiment, the second laser pulse 40 may propagate in a direction of propagation $X_{L2}$, for example substantially collinear with the horizontal thickness direction $X_{T2}$.

As a variant, the direction of propagation $X_{L2}$ of the laser may be inclined with respect to said thickness direction of the second target $X_{T2}$.

With reference to FIG. 4, the interaction between the second laser pulse 40 and the second target 50 created a first displacement of electrons 55 according to a mechanism similar to the mechanism described hereinabove in relation to the interaction between the first laser pulse and the first target.

In one embodiment, the front face 51 of the second target 50 may be sculpted, for example by patterns in relief, so as to control said first displacement of electrons 55.

This first displacement of electrons 55 may be directed from the front face 51 toward the rear face 53 of the second target 50 and may generate displacement currents in the second target 50 which are oriented substantially in the thickness direction $X_{T2}$ of the second target and are located in the prolongation of the focal spot 52 when following the thickness direction $X_{T2}$ of the second target 50.

On account of said first displacement of electrons 55, the electron density in a zone 54 of the second target 50 situated in proximity to the focal spot 52 on the front face 51 of the second target may be lowered.

This lowering of the electron density may produce a second displacement of electrons 56, this time from the second target 50 as a whole toward said zone 54 of the second target situated in proximity to the focal spot, so as to re-establish electron neutrality in said zone 54.

This second displacement of electrons 56 may generate return currents in the second target.

These return currents may be oriented differently from the displacement currents.

The displacement currents and the return currents may then produce magnetic fields 60 in the second target 50.

These magnetic fields 60 may constitute a focusing magnetic field structure 60 which will now be described.

The displacement currents may be oriented in the thickness direction $X_{T2}$ of the second target 50, the magnetic fields 60 may therefore be perpendicular to said thickness direction $X_{T2}$ of the second target 50.

The return currents may be oriented at least in part in a direction radial to the thickness direction $X_{T2}$ of the second target (that is to say having at least one non-zero component in a direction radial to the thickness direction $X_{T2}$) said magnetic fields 60 may thus comprise at least one non-zero component in a circumferential (or ortho-radial) direction, perpendicular to the thickness direction $X_{T2}$ of the second target 50 and to a direction radial to said thickness direction $X_{T2}$.

The magnetic fields 60 situated on either side of an axial direction substantially collinear with the thickness direction $X_{T2}$ of the second target 50 may thus comprise components of opposite senses.

The focusing magnetic field structure 60 formed by said magnetic fields 60 may thus exhibit an axial symmetry with respect to an axis collinear with the thickness direction $X_{T2}$ of the second target 50.

Thus, the focusing magnetic field structure 60 formed by the magnetic fields 60 may have a toroidal or solenoidal geometry about the thickness direction $X_{T2}$ of the second target 50.

In the course of a fourth step d) 2300, a beam of charged particles of high current 10 such as that described hereinabove may penetrate at least partially into said focusing magnetic field structure 60.

The beam of particles 10 may for example propagate in a direction of propagation $X_p$, for example a direction of propagation substantially collinear with the thickness direction $X_{T2}$ of the second target 50.

The direction of propagation of the beam of particles 10 may for example be understood to be the vector average of the directions of propagation of the particles 11 of which the beam is composed.

The beam of particles 10 may be placed so as to penetrate at least partially into the second target 50, for example at the level of its front face 51, for example at the level of the focal spot 52 situated on the front face 51.

The particles 11 of which the beam 10 is composed being charged, they may be deviated by the focusing magnetic field structure 60.

In particular, the focusing magnetic field structure 60 generated by the interaction between the second laser pulse 40 and the second target 50 may thus make it possible to focus said beam of charged particles 10 by deviating at least a significant fraction of the particles of the beam 11.

Said particles 11 may be in particular deviated in the direction of the direction of propagation $X_p$ of said beam 10. That is to say the particles 11 may be deviated in a direction radial to the direction of propagation $X_p$ of the beam.

Depending on the sign of the charge of each of the particles 11 of which the beam of particles 10 is composed, the focusing magnetic field structure 60 may deviate said particle 11 of the beam in the direction of the direction of propagation $X_p$ of said beam or in the opposite direction, that is to say may focus or defocus said beam of particles.

In an alternative embodiment illustrated in FIG. 3*b*, the particle beam 10 may be placed so as to penetrate at least partially into the second target 50 at the level of its rear face 53 and propagate in the second target 50 in the direction of the front face 51.

In this embodiment, the focusing magnetic field structure 60 is inverse to the structure 60 described in the embodiment of FIGS. 1 and 3*a*, that is to say the directions of the magnetic fields 60 of the structure are opposite to the directions of the magnetic fields 60 of the structure of the previous embodiment. The deviation of each of the particles of the beam 11 is thus inverted with respect to the previous embodiment and the beam 10 will be defocused or focused according to the charge of the particles 11 of which it is composed in an inverse manner with respect to the embodiment of FIGS. 1 and 3*a*.

The focusing distance of such a focusing device 100 or generating device 200 may be modulated.

Thus for example, by decreasing the intensity of the second laser 40, the displacements of electrons 55, 56 and therefore the currents generated in the second target 50 may be decreased. In this manner, the magnetic fields generated 60 may be decreased and the deviation of the particles 11 of the beam of particles 10 will be smaller.

The focusing carried out by the focusing device 100 or the generating device 200 may thus be less significant and the focal distance larger.

Conversely, by increasing for example the intensity of the second laser 40, the focusing carried out by the focusing device 100 or the generating device 200 may be increased and the focal distance decreased.

The use of different materials for the second target 50 also makes it possible to influence the focusing carried out by the focusing device 100 or the generating device 200.

The person skilled in the art will be able to choose various materials making it possible to vary the size of the magnetic field generated, in particular as a function of the resistivity of said material and of the dynamics of ionization and of heating of the material such as described for example in the article "Dynamic Control over Mega-Ampere Electron Currents in Metals Using Ionization-Driven Resistive Magnetic Field" of Y. Sentoku et al. (Physical Review Letters, vol. 107, 135005, 2011) and the references cited in this article.

A device for focusing a beam of charged particles of high intensity 100 or a device for generating a focused beam of charged particles of high intensity 200 according to an embodiment of the invention may furthermore comprise various extra modules.

Thus, a vacuum chamber 70 may accommodate said devices 100,200 and in particular at least a laser 40 and a target 50.

The vacuum chamber 70 may be furnished with a window 71 allowing said beam of charged particles 10 to leave the vacuum chamber.

The vacuum chamber 70 may be furnished with a collimator 80 making it possible to stop peripheral radiations or particles at the exit of the device 100,200.

The vacuum chamber 70 may be furnished with a module for stopping radiations, for example comprising a material with high atomic number such as iron, lead or uranium.

The vacuum chamber 70 may also be furnished with a beam deviation module making it possible to separate the charged particle beam and radiations having a similar direction of propagation, for example a deviation module based on magnetic fields.

The vacuum chamber 70 may be evacuated and kept under vacuum by means of one or more vacuum pumps 72.

The invention claimed is:

1. A method for generating a focused beam of charged particles, the method comprising:

a) generating a beam of charged particles;

b) emitting a laser pulse;

c) generating a focusing magnetic field structure in a target by means of an interaction of said laser pulse with said target; and d) causing at least partial penetration of the beam of charged particles into said focusing magnetic field structure, wherein in step b), a laser contrast of the laser pulse is increased.

2. The method according to claim 1, wherein a power of the laser pulse is substantially between 1 terawatt and about 100 terawatts.

3. The method according to claim 1, wherein a duration of the laser pulse is substantially between about 10 femtoseconds and about 10 picoseconds.

4. The method according to claim 1, wherein in step c) the laser pulse is focused on the target at the level of a focal spot, and in step d) the beam of charged particles passes at least partially through said focal spot.

5. The method according to claim 1, wherein the target is made at least in part of a metal.

6. The method according to claim 5, wherein the target is made at least in part of a metal selected from a group comprising gold, copper and aluminum.

7. The method according to claim 6, wherein the thickness of the target lies substantially between 500 nanometers and about 100 micrometers.

8. The method according to claim 1, wherein the target extends substantially along a plane of extension between a front face and a rear face, said faces being opposite to one another in a thickness direction perpendicular to the plane of extension and separated by a thickness measured in said thickness direction, and in step d) said beam passes through the target substantially in said thickness direction.

9. The method according to claim 1, wherein step a) of generating a particle beam comprises:

emitting a generating laser purse; and generating a non-focused beam of particles by means of an interaction of said generating laser pulse with a generating target.

10. A device for generating a focused beam of charged particles, the device comprising:

means for generating a beam of charged particles;

a laser source for emitting a laser pulse;

a target for generating a focusing magnetic field structure by means of an interaction of said laser pulse with said target, said beam of charged particles penetrating at least partially into said magnetic field structure; and a device for increasing a laser contrast of the laser pulse.

11. The device according to claim 10, wherein the means for generating a beam of charged particles comprising:

a laser source for emitting a generating laser pulse; and a generating target for generating a beam of charged particles upon an interaction of said generating laser pulse with said generating target.

* * * * *